United States Patent [19]

Mukoujima

[11] Patent Number: 5,563,538
[45] Date of Patent: Oct. 8, 1996

[54] CONTROL CIRCUIT FOR CLOCK MULTIPLIER

[75] Inventor: Toshiaki Mukoujima, Tokyo, Japan

[73] Assignee: Oki Electric Industry Co., Ltd., Tokyo, Japan

[21] Appl. No.: 433,323

[22] PCT Filed: Sep. 8, 1994

[86] PCT No.: PCT/JP94/01481

§ 371 Date: May 5, 1995

§ 102(e) Date: May 5, 1995

[87] PCT Pub. No.: WO95/08217

PCT Pub. Date: Mar. 23, 1995

[30] Foreign Application Priority Data

Sep. 17, 1993 [JP] Japan ................................. 5-231538

[51] Int. Cl.⁶ ............................. H03B 19/00; G06F 7/44
[52] U.S. Cl. ........................... 327/116; 327/119; 327/356
[58] Field of Search ...................... 327/113, 114, 327/116, 119, 122, 355, 356

[56] References Cited

U.S. PATENT DOCUMENTS

| | | | |
|---|---|---|---|
| 3,710,253 | 1/1973 | O'Neill | 327/356 |
| 5,291,081 | 3/1994 | Takeuchi et al. | 327/114 |
| 5,438,245 | 8/1995 | Kii et al. | 327/114 |

FOREIGN PATENT DOCUMENTS

| | | | |
|---|---|---|---|
| 50-137646 | 10/1975 | Japan . | |
| 51-130156 | 12/1976 | Japan . | |
| 56-47139 | 4/1981 | Japan . | |
| 58-41694 | 9/1983 | Japan . | |
| 61-173518 | 8/1986 | Japan . | |
| 61-224615 | 10/1986 | Japan | 327/116 |
| 3-1730 | 1/1991 | Japan . | |
| 3-136515 | 6/1991 | Japan | 327/116 |

OTHER PUBLICATIONS

Tsukuda, A. et al., "2.4 Gb/s Timing Recovery Circuit Module", published in Mar. 1992, Spring Meeting for Electronics, Information and Communication, pp. 4–135.

Primary Examiner—Toan Tran
Attorney, Agent, or Firm—Spencer & Frank

[57] ABSTRACT

A control circuit for a clock includes a clock multiplier having an input for receiving a clock signal, an amplifier and an output. The clock multiplier multiplies the clock signal and produces an amplified, multiplied clock signal at the output. The amplifier has a reference voltage control input for setting a value of a reference voltage in the amplifier. A peak detection circuit is provided for detecting an amplitude value of the clock signal at the input of the clock multiplier. A comparator is provided for comparing the amplitude value detected at the peak detection circuit with a further reference voltage previously set less than an amplitude value of the clock signal. A switching is coupled to the output of the comparator and to the reference voltage control input of the amplifier in the clock multiplier for switching the further reference voltage according to the output of the comparator.

4 Claims, 3 Drawing Sheets

FIG. I

CONTROL CIRCUIT FOR CLOCK MULTIPLIER

BACKGROUND OF THE INVENTION

1. Technical Field

This invention relates to a control circuit for an output clock of a clock multiplier used for optical transmission equipment and multiplexers in a digital transmission system. More specifically, the invention relates to a control circuit for a clock multiplier capable of controlling the output signal when a multiplied signal is present at the output due to influences of noise while no input clock signal is applied to the input of the clock multiplier.

2. Background Art

A clock multiplier may be required, for example, in a general digital system, when the speed of a main processing unit is set at V/x to get phase margin regarding the processing in a system, in which processing is implemented by the speed V at the input and by the speed V at the output. To output from the system such a signal processed at the speed V/x as a signal with the speed V, data must be converted into data with the speed V on the basis of a clock having the speed V/x used for processing multiplied x times.

A clock multiplier is required in the situation described above. In a conventional clock multiplier, a limiter amplifier is provided in order for restituting a loss occurring when a signal is fed to the input terminal of the clock multiplier, a loss caused by an insertion of a band pass filter, and the like. To sufficiently restitute such losses, a limiter amplifier having a gain of about 32 dB is typically used. However, when the limiter amplifier has a high gain, input of noise may be amplified even if no input signal is applied. Upon amplification of noise, a signal having amplitude and frequency equivalent to the multiplied clock obtainable when an input signal is applied, can be produced at the output terminal.

Though no known publication properly discloses a control circuit for a clock multiplier that controls the output of a multiplier as last mentioned, Japanese Unexamined Patent Publication Sho No. 56-47,139, does disclose control of an output clock. The control circuit shown in this Japanese Patent Publication includes a circuit for detecting signal loss and a gate circuit are inserted between the output of the regenerated clock signal and an output terminal. With the control circuit thus constituted, particularly when a high frequency signal is used as a clock signal, the gate circuit to be inserted is required to have high performance electrical characteristics, representatively, such as rise time. Such a gate circuit, however, is expensive. The number of connection points for a high frequency signal increases in order to insert the gate circuit, thereby inducing waveforms of the clock signal to be impaired.

SUMMARY OF THE INVENTION

It is an object of the invention to provide a control circuit for a clock multiplier which solves problems arising out of conventional clock multipliers and control circuits therefor.

A control circuit for a clock multiplier according to the invention includes a clock multiplier for multiplying an input clock signal. The clock multiplier includes an amplifier for amplifying the multiplied clock signal for producing an amplified, multiplied clock signal at an output of the clock multiplier. A peak detection circuit is provided for detecting an amplitude value of the input clock signal. A comparator compares the amplitude value detected at the peak detection circuit with a first reference voltage, and a switching means is provided for switching a second reference voltage of the amplifier of the clock multiplier.

The switching mean includes an analog switching circuit controlled by the output of the comparator through an input switching terminal. When the input at the input switching terminal indicates a high level, an open terminal is selected as the input of the analog switching circuit. When the input at the input switching terminal indicates a low level, the switching means selects, as an input of the analog switching circuit, a terminal that is set to the maximum voltage level of the signal fed to the amplifier.

When the input of the analog switching circuit is connected to the open terminal, the second reference voltage is set to a self-bias voltage of the amplifier. When the input of the analog switching circuit is connected to the terminal that is set to the maximum voltage level of the signal fed to the amplifier the second reference voltage is set to the maximum voltage level of the signal fed to the amplifier.

DETAILED DESCRIPTION OF THE PREFERRED EMBODIMENT

Figure 1:
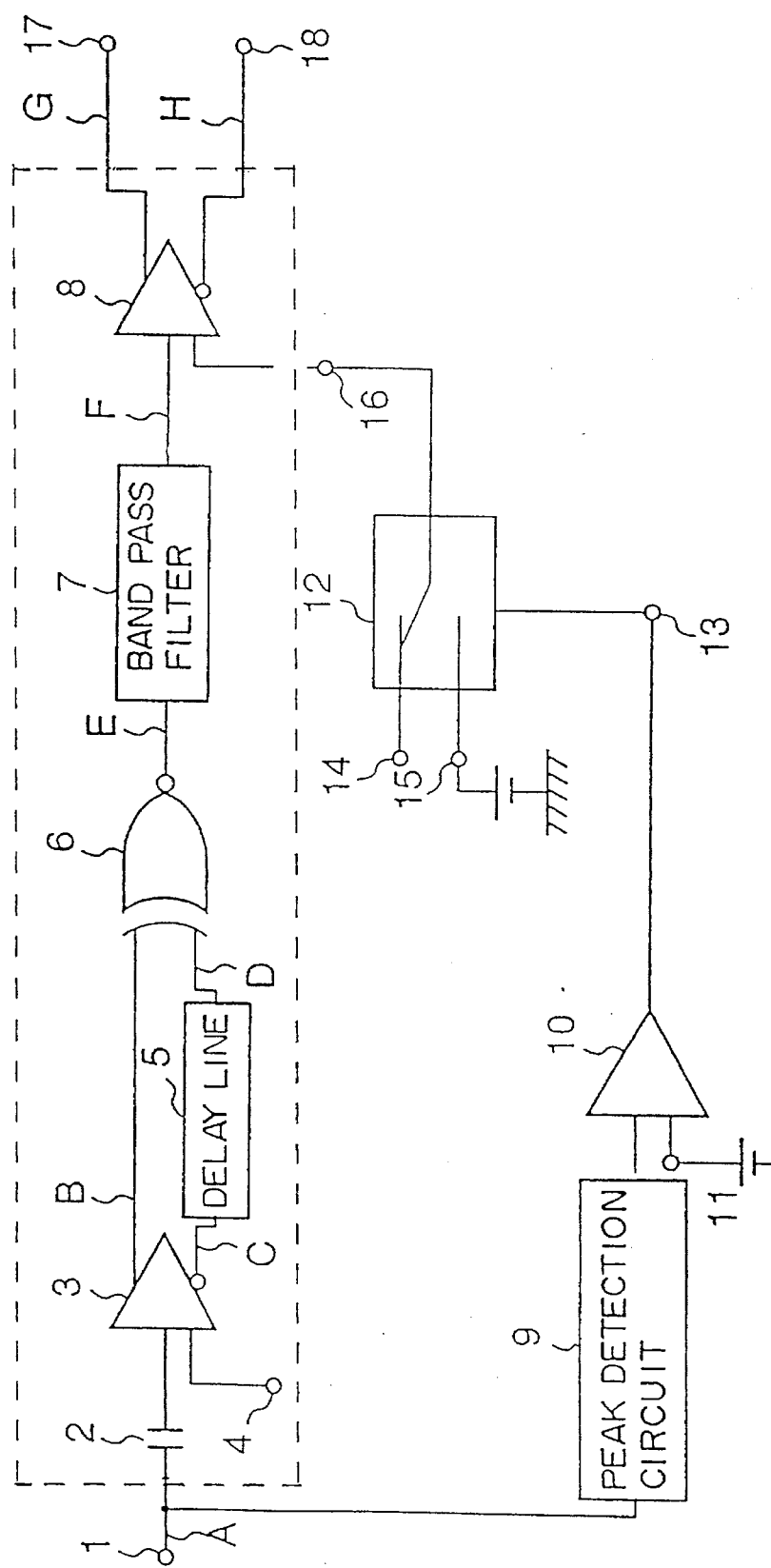
FIG. 1 is a control circuit for clock multiplier according to the invention.
Figure 2:
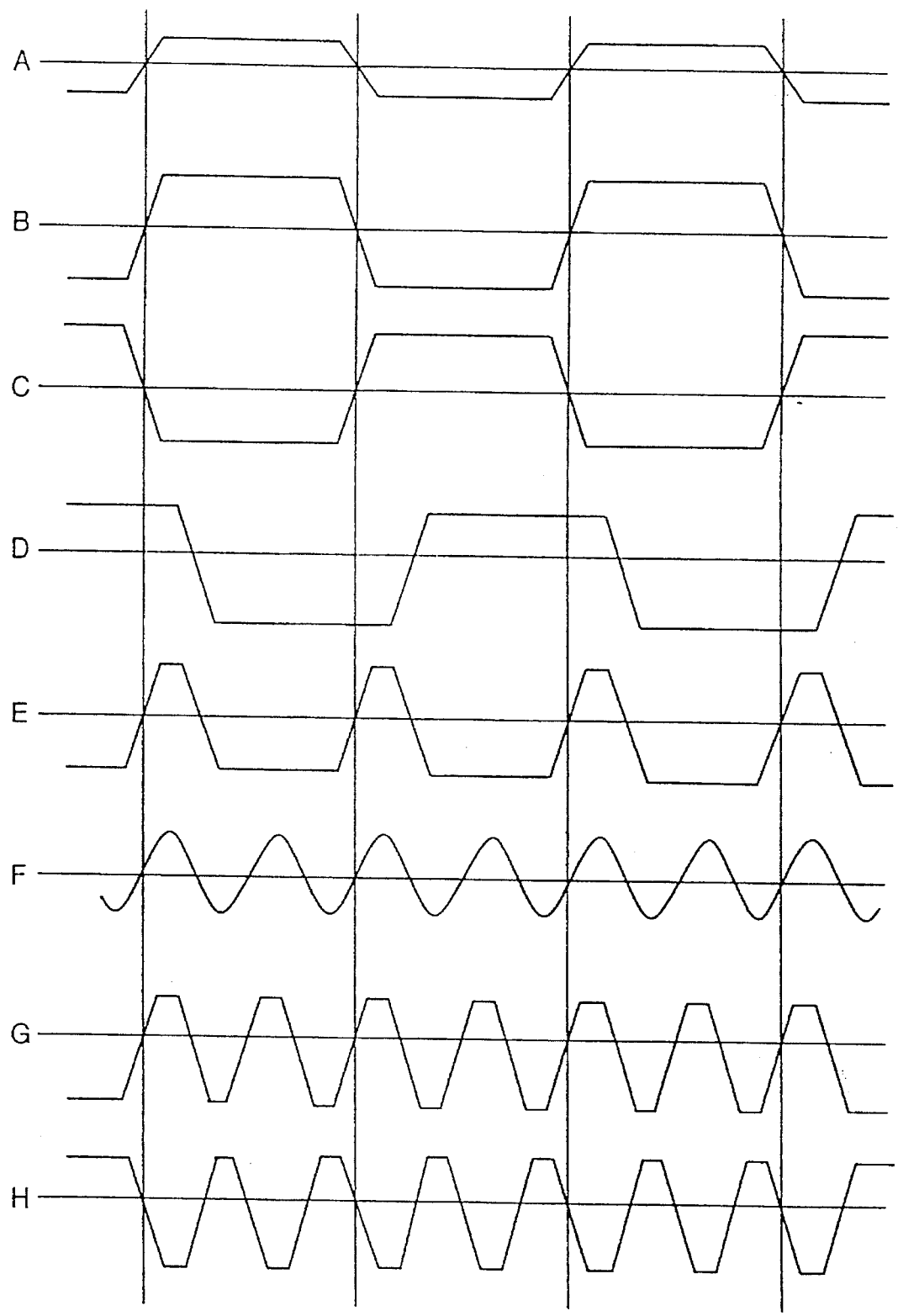
FIG. 2 is a timing chart for the control circuit for clock multiplier according to the invention.

FIG. 1 is a control circuit for a clock multiplier according to the invention. FIG. 2 is a timing chart for the control circuit for the clock multiplier in FIG. 1. An example of the clock multiplier is shown by a circuit portion enclosed by a broken line in FIG. 1. An input terminal 1 is connected to a capacitor 2. The capacitor 2 is connected to a first limiter amplifier 3. A terminal 4 is an open terminal of the first limiter amplifier 3. An output of the first limiter amplifier 3 is connected to an exclusive-nor gate 6. A negative output of the first limiter amplifier 3 is connected to the exclusive-nor gate 6 through a delay line 5. An output of the exclusive-nor gate 6 is connected to a band pass filter 7. An output of the band pass filter 7 is connected to a second limiter amplifier 8. The second limiter amplifier 8 is connected to an output terminal 17 and an output terminal 18 fed with an inverted signal of the signal at the terminal 17.

Now, the connections among circuit components constituting a control circuit will be described. The input terminal 1 is connected to a peak detection circuit 9. The peak detection circuit 9 is connected to the comparator 10. A reference voltage input terminal 11 is also connected to the comparator 10. The comparator 10 is connected to an analog switch 12 through an input switching terminal 13. The analog switch 12 is formed with input terminals 14, 15. The analog switch 12 is further connected to the limiter amplifier 8 through a logic threshold reference (control) terminal 16.

Operation of the control circuit for the clock multiplier thus constituted will be described with reference to FIG. 2. First, operation of the portion constituting the clock multiplier will be described. A clock signal having a cycle 2T is fed at the input terminal 1. The waveform of the input signal A is shown by A in FIG. 2. The input signal indicated by A may have a smaller amplitude due to loss and the like during the step of being fed to the input terminal 1. Hence, the signal A is first fed to the capacitor 2 of the clock multiplier circuit to adjust its level. The output signal from the capacitor 2 is fed to the first limiter amplifier 3. The limiter amplifier 3 is defined as an amplifier setting a limit value of an amplified signal. The limiter amplifier 3 here sets the limit value to the original amplitude value of the input signal. The amplitude of the signal A, impaired due to the loss, is restituted by reforming the waveform at the first limiter amplifier 3 to produce signal B as shown in FIG. 2.

The signal B is fed to the exclusive-nor gate 6. If four times multiplying is considered, and if the cycle and the pulse width are set to 2T and T, respectively, the signal C which is an inversion of the signal B is fed to the delay line 5, thereby being delayed by 1/4T cycle. In this control circuit for the clock multiplier, if the multiplication factor is set to N, the signal is delayed by (1/N) T. The signal D, delayed at the delay line 5, is also fed to the exclusive-nor gate 6. Therefore, the signals B and D are fed to the exclusive-nor gate 6. A logic operation of exclusive-nor of the signals B and D is implemented at the exclusive-nor gate 6 and provides signal E as shown in FIG. 2. The signal E is fed to the band pass filter 7. The band pass filter 7 may be comprised of a surface acoustic wave (SAW) filter. The band pass filter 7 can extract a necessary frequency signal of the multiplied clock. In this embodiment, the multiplication factor N equals 4 so that a waveform having a frequency corresponding to four times the frequency of the input signal is extracted to obtain signal F. The waveform of the signal F as the output of the band pass filter 7 as shown in FIG. 2. As shown in FIG. 2, the signal F, as the multiplied signal of the input signal A, has a deteriorated waveform due to, for example, insertion loss of the SAW filter or electrical power loss when passing the band pass filter 7. To restitute such losses, the output of the band pass filter 7 is fed to the second limiter amplifier 8. The second limiter amplifier 8 is also an amplifier similar to the first limiter amplifier 3, and sets the limit value of the amplified signal to an amplitude of a multiplied signal to be obtained. The second limiter amplifier 8 restitutes deteriorations of the waveform of the signal F.

Figure 3:
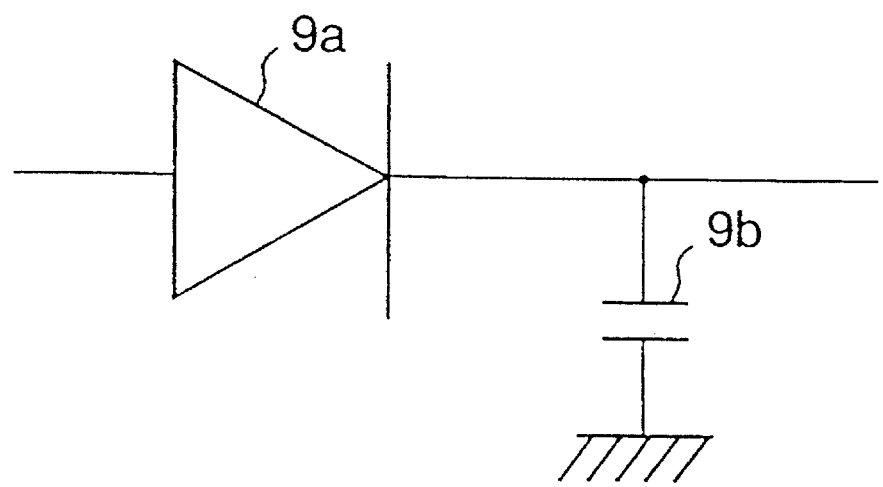
FIG. 3 is a peak detection circuit.

Next, operation of the control circuit will be described. The signal A fed to the input terminal 1 is fed to the capacitor 2 of the clock multiplier and to the peak detection circuit 9. The configuration of the peak detection circuit 9 is shown in FIG. 3. The peak detection circuit 9 in this embodiment is constituted of a diode 9a and a capacitor 9b. The diode 9a passes a signal having a voltage greater than the forward bias the diode 9a and does not pass a signal having voltage below the forward bias of diode 9a. A diode having a forward bias less than the amplitude value of the input signal is used here as diode 9a. When a clock having a smaller amplitude than the forward bias of the diode 9a is fed to input terminal 1, the signal does not pass diode 9a, so that a zero level is obtained from the output of the peak detection circuit, 9. The circuit thus operates similarly when noise is applied as described below. Although in this embodiment detection circuit 9 comprises the diode 9a and the capacitor 9b, the peak values can be detected by the operation described below even if only capacitors constitute the peak detection circuit 9.

The signal fed to the peak detection circuit 9, after passing the diode 9a, gradually charges the capacitor 9b up to the peak value of the amplitude. If there is an input clock, it is charged up to the peak value of the amplitude of the signal A, and therefore, the peak detection circuit 9 detects the peak value.

The peak value is fed to the comparator 10. The peak value of the amplitude is compared at the comparator 10 with the first reference voltage fed from the reference voltage input terminal 11. The first reference voltage is previously set to a value less than the amplitude of the input clock signal. The comparator 10 outputs a signal having a high level when the peak value of the amplitude as the output of the peak detection circuit 9 is greater than the first reference voltage, and outputs a signal having a low level when less. Therefore, where there is an input clock, the peak value of the amplitude detected at the peak detection circuit 9 is always greater than the first reference voltage, so that the output of the comparator 10 becomes the signal of high level. The output signal of the comparator 10 is fed to the input switching terminal 13 of the analog switching circuit 12.

When the signal fed to the input switching terminal 13 is at a high level, the open input terminal 14 is selected as the input of the analog switching circuit 12. The analog switching circuit 12 controls the value of the second reference voltage inside the second limiter amplifier 8 according to the value of the voltage of the input terminal to be connected. The analog switching circuit 12 is connected to the second limiter amplifier 8 through the logic threshold reference terminal (control) 16. When the open input terminal 14 is selected as an input of the analog switching circuit 12, because the input terminal 14 is open, the second reference voltage is controlled through the logic threshold reference terminal 16 to be set to the self-biased DC voltage of the second limiter amplitude 8. The second limiter amplifier 8 outputs a high signal level when the input signal is greater than the second reference voltage, and outputs a low signal level when the input signal is less.

Accordingly, signal G restituting the loss in the signal F fed to the second limiter amplifier 8 is obtained at the output terminal 17 of the second limiter amplifier 8. Signal H, which is the inverse of the signal G, is obtained at the output terminal 18. The waveforms of the signals G, H are shown by G, H, respectively, in FIG. 2. A clock output signal having a frequency which is the frequency of the input signal multiplied by four is thus obtained at the output terminals 17, 18.

The following is a description of the operation of the control circuit when no input signal is applied to the input terminal 1. Electrical noise can be present at terminal 1 even if no input signal is applied. Because the first limiter amplifier 3 has a high gain, noise would be amplified and the amplified noise would be multiplied by the clock multiplier in the same manner as when an input signal is applied to terminal 1. The resulting multiplied noise signal obtained as the signal F and fed to the second limiter amplifier 8.

Meanwhile, this noise is also fed to the control circuit. Noise having a small amplitude is not recognized because of the diode 9a of the peak detection circuit 9. Although a portion of the noise having a large amplitude may pass through the diode 9a, the capacitor 9b is little charged because the portion of noise that does not pass diode 9a is extensive. Therefore, the value detected as the peak value at the peak detection circuit 9 has a nearly zero level. This nearly zero level signal is compared at the comparator 10 with the first reference voltage at the reference voltage input terminal 11. The first reference voltage has a voltage that is slightly less than the value of the amplitude of the input clock signal, and is greater than the nearly zero level. Therefore, because the peak value of the detected amplitude is less than the first reference voltage, the output of the comparator 10 becomes a low level signal. When the low level output of the comparator 10 is fed to the input switching control terminal 13, the input terminal 15 is selected as the input of the analog switching circuit 12. The input terminal 15 is set to the maximum voltage level of the signal fed to the second limiter amplifier 8. The second reference voltage controlled through the logic threshold reference terminal 16 is therefore set to the maximum voltage level of the input signal of the second limiter amplifier 8.

If the signal F fed to the second limiter amplifier 8 is compared with the second reference voltage, the value of the signal F is always less than the second reference voltage. Therefore, a low level signal is obtained as the output of the second limiter amplifier 8, and a stable low level signal is obtained at the output terminal 17.

Thus, even when noise is amplified and a multiplied signal is eventually obtained, the output signal can be controlled by detecting that there is, in fact, no input clock signal and by making comparison at the limiter amplifier 8 with the second reference voltage which is set to reflect the lack of an input clock signal.

The foregoing embodiment of the clock multiplier is only exemplary, as various other structures for implementing the principles of the invention would occur to a person of ordinarily skilled in the art. Furthermore, it would be apparent to a person skilled in the art that the control circuit as used for the clock multiplier according to the foregoing description, can be used for controlling output signals of receivers or the like other than a clock multiplier.

INDUSTRIAL APPLICABILITY

As described above, the control circuit for a clock multiplier is effectively used for high speed digital signal processing equipment, optional transmission equipment, multipliers and switching systems.

I claim:

1. A control circuit for a clock multiplier, comprising:

a clock multiplier including an input for receiving a clock signal, an amplifier and an output, said clock multiplier multiplying the clock signal and producing an amplified, multiplied clock signal at said output, said amplifier having a reference voltage control input for setting a value of a reference voltage in the amplifier;

a peak detection circuit for detecting an amplitude value of the clock signal at the input of the clock multiplier;

a comparator for comparing the amplitude value detected at the peak detection circuit with a further reference voltage previously set less than the amplitude value of the clock signal; and control means having an output coupled to the reference voltage control input of the amplifier in the clock multiplier and being responsive to the output of the comparator for controlling the reference voltage in the amplifier according to the output of the comparator.

2. The control circuit as claimed in claim 1, wherein the control means comprises an analog switch circuit having selectable first and second inputs, the first input being connected to an open terminal and the second input being coupled to a voltage corresponding to the maximum voltage level of a signal fed to the amplifier, the analog switch circuit being controlled by the output of the comparator so that when the output of the comparator indicates that the amplitude value detected at the peak detection circuit is at a higher level than the further reference voltage, the first input is selected to be present at the output of the control means, and when the output of the comparator indicates that the amplitude value detected at the peak detection circuit is a lower value than the further reference voltage, the second input is selected to be present at the output of the control means.

3. The control circuit as claimed in claim 2, wherein the reference voltage in the amplifier of the clock multiplier is set to a self-bias voltage of said amplifier when the first input of the analog switching circuit is selected and is set to the maximum voltage level of the signal fed to the amplifier when the second input of the analog switching circuit is selected.

4. A control circuit for a clock multiplier, comprising:

a clock multiplier having an input for receiving a clock signal and an output for producing a multiplied clock signal, said clock multiplier including a first limiter amplifier, a logic circuit, a bandpass filter and a second limiter amplifier connected in series, the second limiter amplifier having a reference voltage control input for setting the value of a reference voltage of the second limiter amplifier;

a peak detection circuit for detecting an amplitude of the clock signal at the input of the clock multiplier;

a comparator for comparing the amplitude value detected at the peak detection circuit with a further reference voltage previously set less than the amplitude value of the clock signal; and an analog switch having an output coupled to the reference voltage control input of the second limiter amplifier and being responsive to the output of the comparator for controlling the reference voltage of the second limiter amplifier according to the output of the comparator, wherein when the output of the comparator indicates that the amplitude value detected at the peak detection circuit is at a higher level than the further reference voltage, an open terminal is selected as the input of the analog switch circuit so that the reference voltage of the second limiter amplifier is set to a self-bias voltage of the second limiter amplifier, and when the output of the comparator indicates that the amplitude value detected at the peak detection circuit is a lower value than the further reference voltage, a second terminal set to the maximum voltage level of the signal fed to the second limiter amplifier is selected as the input of the analog switch circuit and the reference voltage level of the second limiter amplifier is set to the maximum voltage level of the signal fed to the second limit amplifier.

* * * * *